US006189363B1

(12) United States Patent
Lai

(10) Patent No.: US 6,189,363 B1
(45) Date of Patent: Feb. 20, 2001

(54) STRUCTURE OF MOLDING TOOL FOR MANUFACTURING COOLING FINS

(76) Inventor: Yaw-Huey Lai, 12F, No. 222-3, Chi Hsien Road, Lu Chou City, Taipei Hsien (TW)

(*) Notice: Under 35 U.S.C. 154(b), the term of this patent shall be extended for 0 days.

(21) Appl. No.: 09/417,094

(22) Filed: Oct. 13, 1999

(51) Int. Cl.[7] .......... B21D 22/00

(52) U.S. Cl. .......... 72/358; 72/267; 29/890.03

(58) Field of Search .......... 72/253.1, 264, 72/266, 267, 352, 358, 359; 29/890.03

(56) References Cited

U.S. PATENT DOCUMENTS

| | | | |
|---|---|---|---|
| 4,051,708 | * 10/1977 | Beane et al. | 72/358 |
| 4,706,051 | * 11/1987 | Dieleman et al. | 72/267 |
| 4,879,891 | * 11/1989 | Hinshaw | 72/254 |
| 5,937,517 | * 8/1999 | Smith et al. | 29/890.03 |

FOREIGN PATENT DOCUMENTS

| | | | |
|---|---|---|---|
| 2-205214 | * 8/1990 | (JP) | 72/267 |

* cited by examiner

*Primary Examiner*—Ed Tolan
(74) *Attorney, Agent, or Firm*—Browdy and Neimark

(57) ABSTRACT

A molding tool is designed to make a cooling device and is formed of a lower mold, a lower mold housing, a punching head, and an urging plate. The lower mold is provided with a plurality of through holes. The lower housing is provided with a molding hole and is fixed on the lower mold such that the molding hole is corresponding in location to the through holes of the lower mold. The punching head is fastened with the bottom of the upper mold seat of a punching machine and is provided with a plurality of cavities and ribbed slots. The urging plate is provided with an opening and is disposed under the upper mold seat of the punching machine such that the punching head is put through the opening. The urging plate is further provided with an insertion slot extending along the edge of the opening. A blank is held in the molding hole of the lower mold housing such that the blank is extruded by punching head to form a plurality of cooling fins in the through holes of the lower mold, and that the blank is filled in the cavities, the ribbed slots and the insertion slot to facilitate the releasing of the cooling fins from the molding tool.

6 Claims, 10 Drawing Sheets

STRUCTURE OF MOLDING TOOL FOR MANUFACTURING COOLING FINS

FIELD OF THE INVENTION

The present invention relates generally to a cooling device, and more particularly to a molding tool for manufacturing the cooling device.

BACKGROUND OF THE INVENTION

As shown in FIG. 1, a prior art cooling device 1 is intended for use in a CPU (central processing unit) and is formed of a base 3. The base 3 is provided with a plurality of cooling fins 4. Now referring to FIG. 2, a prior art molding tool 7 is shown for manufacturing the cooling fins 8 by extrusion molding. In the process of making the cooling fins, the structural strength of the molding tool 7 must be taken into consideration in relation to the pressure of the extrusion molding. The ratio of height (H) and width (W) of the cooling fins 8, as well as the distance (D) between the two cooling fins 8 must be kept in an appropriate range. If the cooling fins 8 are too thin, the molding tool 7 is susceptible to damage in the extrusion molding. If the cooling fins 8 are excessively thick, there will be less cooling fins 8 to result in a reduction in the cooling area.

SUMMARY OF THE INVENTION

The primary objective of the present invention is to provide a molding tool for manufacturing a cooling device having a plurality of cooling fins capable of removing heat effectively.

In keeping with the principle of the present invention, the foregoing objective of the present invention is attained by a molding tool comprising a lower mold, a lower mold housing, a punching head, and an urging plate. The lower mold is provided with a plurality of through holes. The lower mold housing is provided with a molding hole and is fixed on the lower mold such that the molding hole is corresponding in location to the through holes of the lower mold. The punching head is fastened with the bottom of the upper mold seat of a punching machine and is provided with a plurality of cavities and ribbed slots. The urging plate is provided with an opening and is disposed under the upper mold seat of the punching machine such that the punching head is put through the opening. The urging plate is further provided at the bottom thereof with an insertion slot extending along edge of the opening. A blank is first kept in the molding hole of the lower mold housing and is then extruded by the punching head to form a plurality of cooling fins in the through holes of the lower mold. The cavities and the ribbed slots are filled with the blank, so as to facilitate the releasing of the cooling fins from the molding tool.

DETAILED DESCRIPTION OF THE INVENTION

Figure 1:
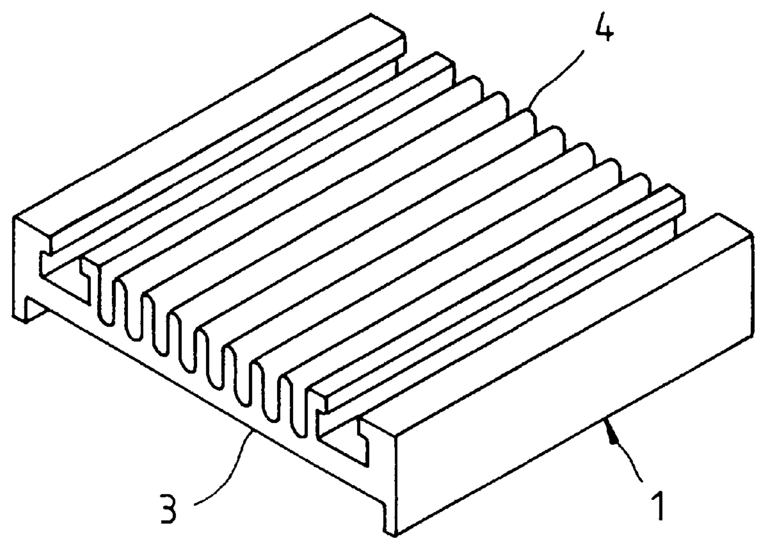
FIG. 1 shows a perspective view of a prior art cooling device for use in a central processing unit.
Figure 2:
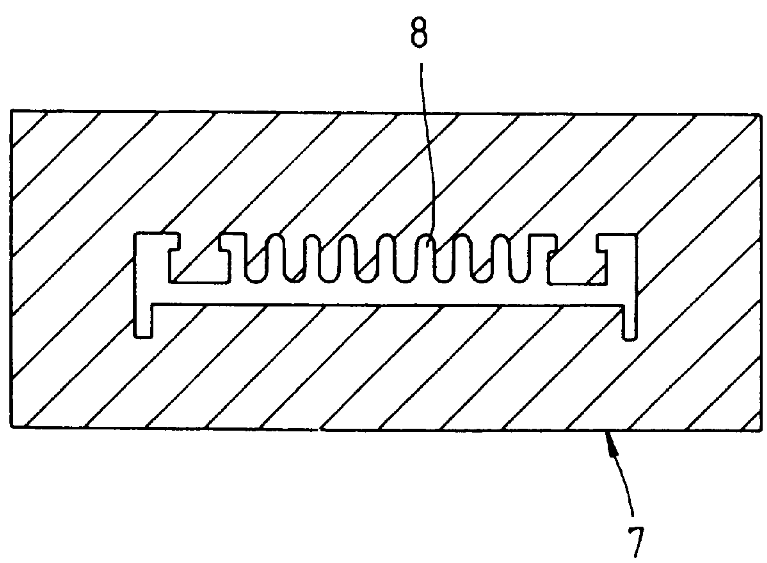
FIG. 2 shows a cross-sectional view of a molding tool for making the prior art cooling device as shown in FIG. 1.
Figure 3:
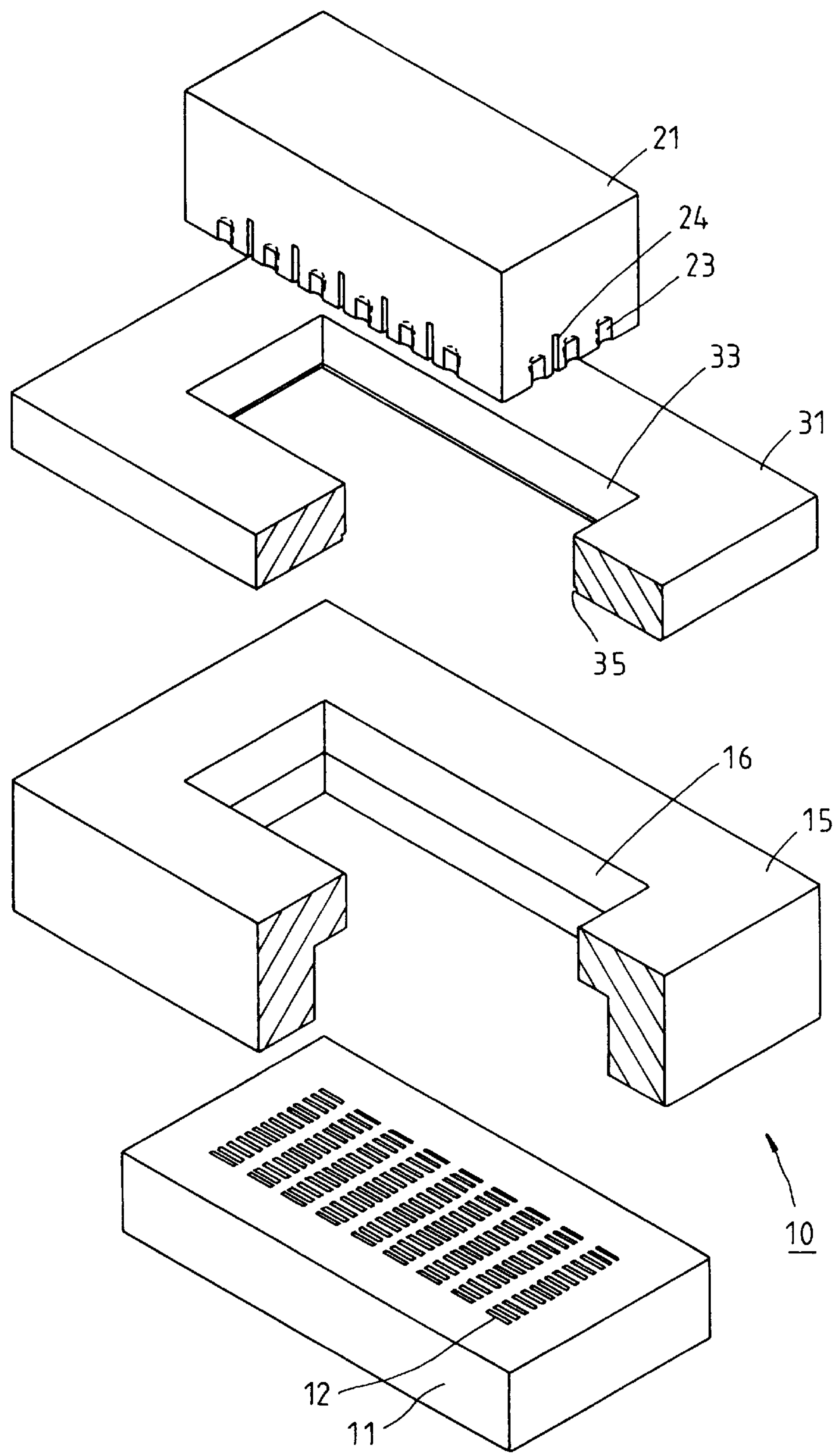
FIG. 3 shows an exploded view of a molding tool of a first preferred embodiment of the present invention.
Figure 4:
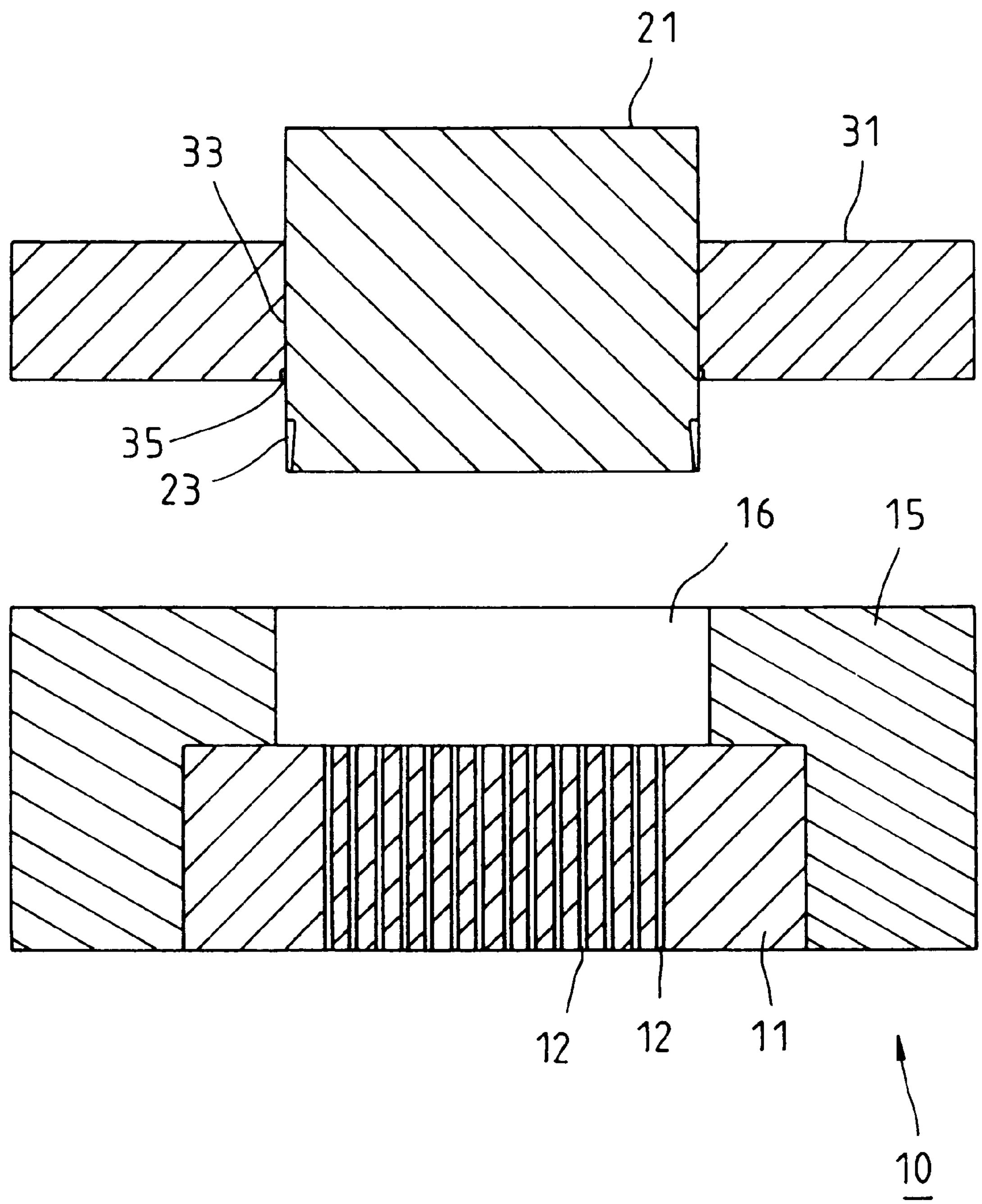
FIG. 4 shows a partial sectional view of the first preferred embodiment of the present invention in combination.

As shown in FIGS. 3 and 4, a molding tool 10 embodied in the present invention is intended for use in making a cooling device having a plurality of cooling fins. The molding tool 10 comprises a lower mold 11, a lower mold housing 15, a punching head 21, and an urging plate 31.

The lower mold 11 is mounted on the lower mold seat 81 of a punching machine (not shown in the drawings) and is provided with a plurality of through holes 12.

The lower mold housing 15 is provided at the center thereof with a molding hole 16. The lower mold housing 15 is mounted on the lower mold 11 such that the molding hole 16 is corresponding in location to the through holes 12 of the lower mold 11.

The punching head 21 has a cross-sectional profile which is corresponding to the molding hole 16. The punching head 21 is provided in the bottom edge of the periphery thereof with a plurality of cavities 23 and ribbed slots 24. The cavities 23 are biased and have an arcuate cross section. The ribbed slots 24 are biased. The punching head 21 is mounted securely at the bottom of an upper mold seat 83 of the punching machine such that the punching head 21 is received in the molding hole 16 at the time when the punching head 21 is driven downward. When the punching head 21 is received in the molding hole 16, the punching head 21 does not come in contact with the inner wall of the molding hole 16. In the meantime, the underside of the punching head 21 is kept apart from the top of the lower mold 11 by a predetermined distance.

The urging plate 31 is provided at the center thereof with an opening 33 and is disposed under the upper mold seat 83 of the punching machine such that the punching head 21 is put through the urging plate 31 via the opening 33. The urging plate 31 is provided at the bottom thereof with an insertion slot 35 extending along the edge of the opening 33.

Figure 5:
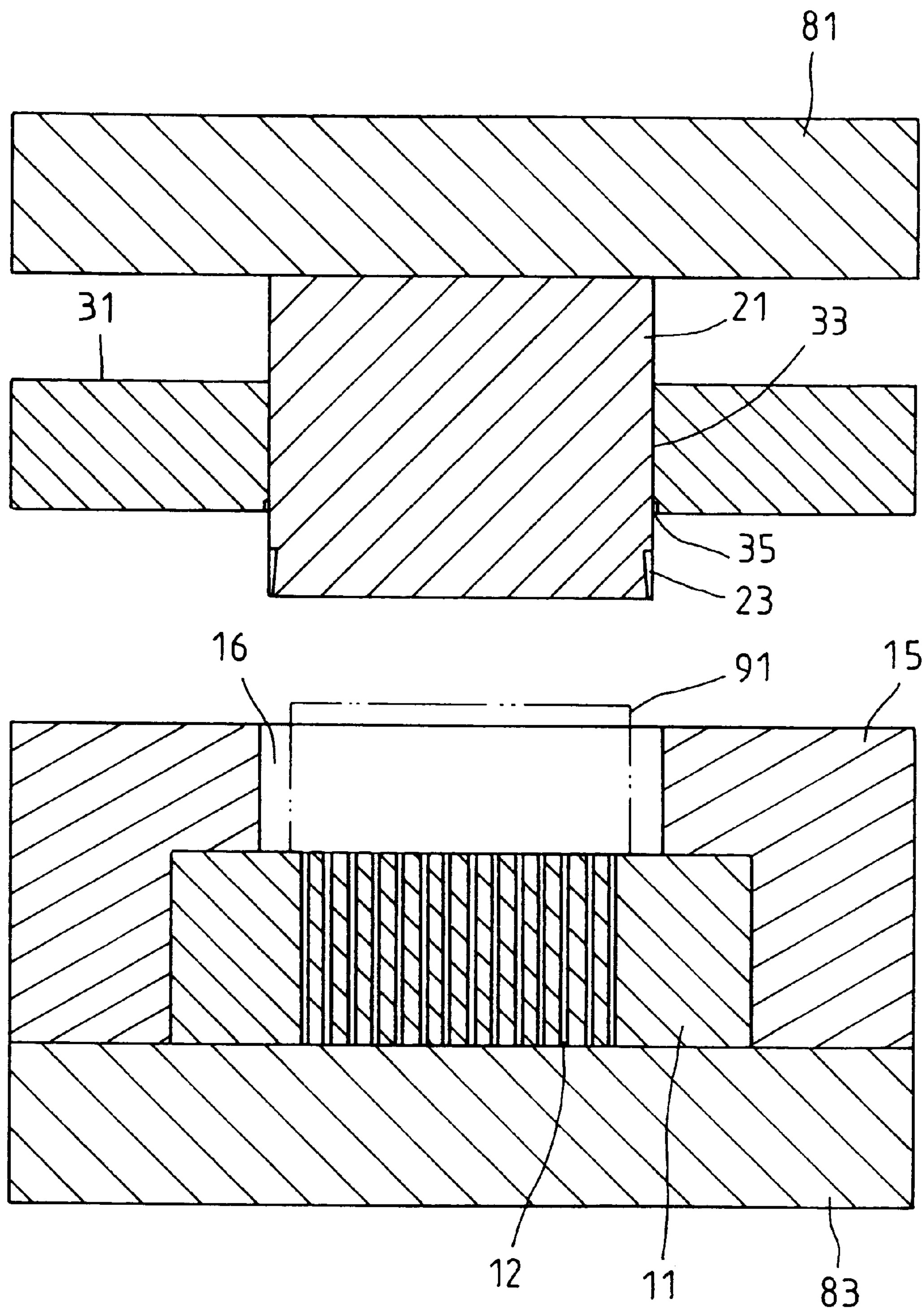
FIG. 5 shows a schematic view of the blank being kept in the molding hole of the first preferred embodiment of the present invention.
Figure 6:
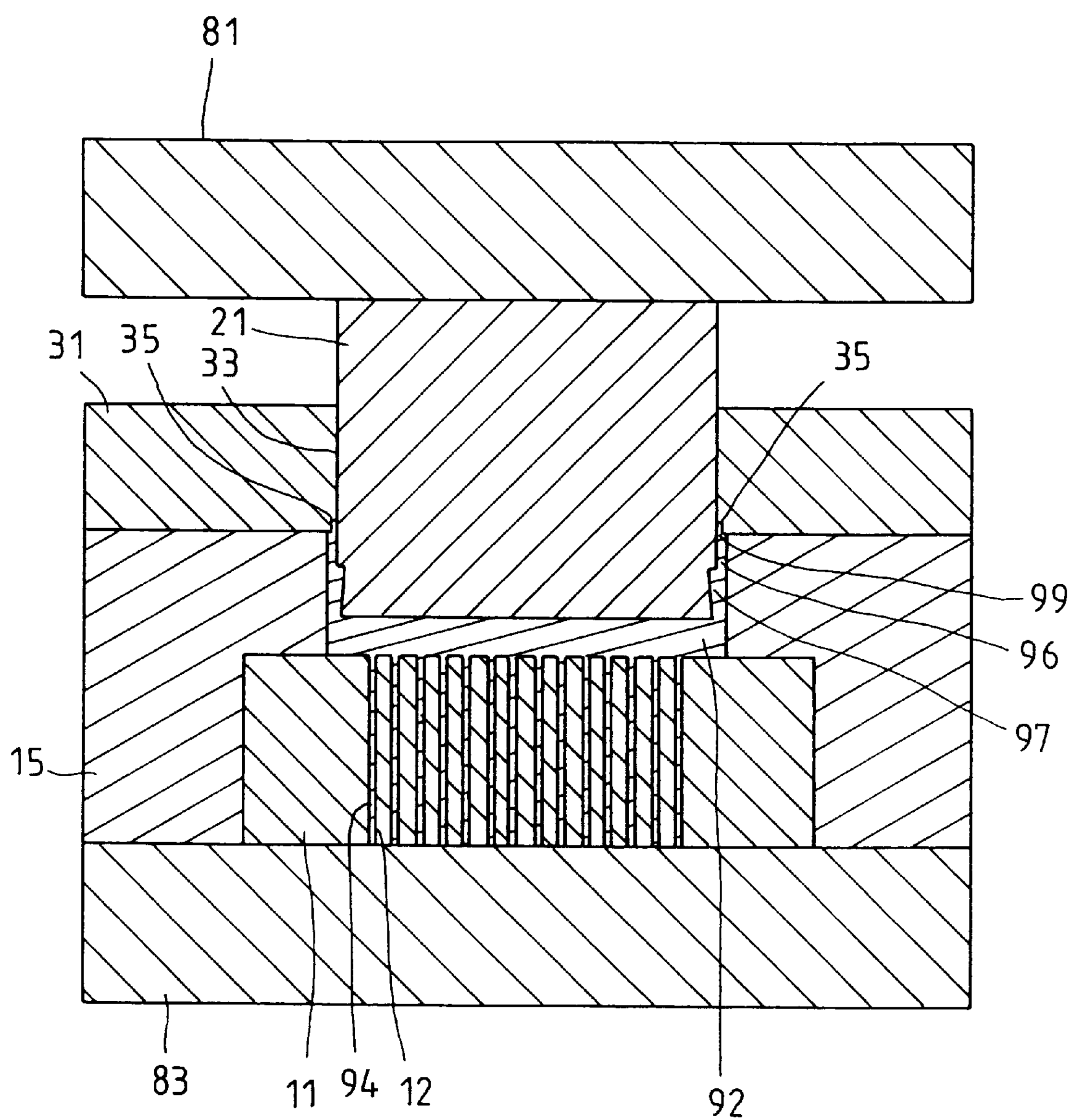
FIG. 6 shows a schematic view of the punching head of the first preferred embodiment of the present invention at work.
Figure 8:
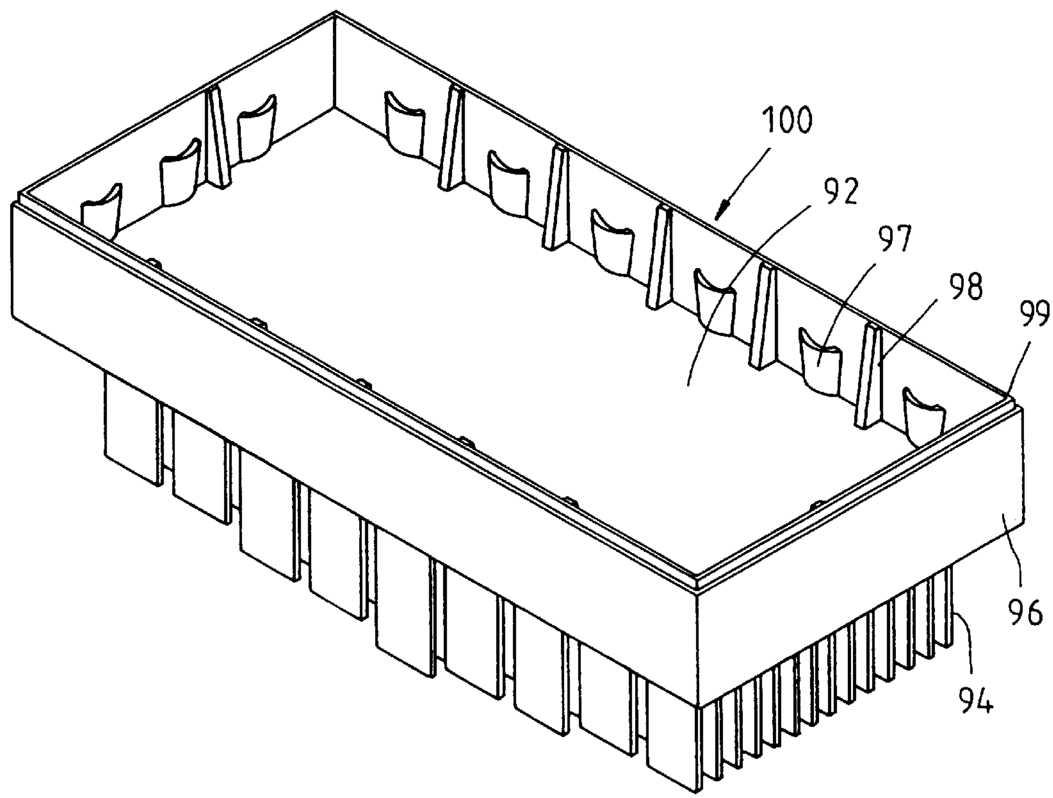
FIG. 8 shows a perspective view of a freshly-formed cooling device of the first preferred embodiment of the present invention.

As illustrated in FIG. 5, the process of making the cooling device by the molding tool 10 of the present invention involves a first step in which a blank 91, such as an aluminium block, is placed in the molding hole 16 of the lower mold housing 15. Thereafter, the upper mold seat 83 of the punching machine is driven downward such that the punching head 21 is forced into the molding hole 16, as shown in FIG. 6, and that the underside of the urging plate 31 presses against the top of the lower mold housing 15. As a result, a base plate 92 is formed by the blank 91 such that the base plate 92 is located between the punching head 21 and the lower mold 11. In the meantime, a plurality of cooling fins 94 are integrally made with the base plate 92 by the through holes 12 of the lower mold 11. A smooth ring 96 is integrally formed with the base plate 92 between the punching head 21 and the inner wall of the molding hole 16 of the lower mold housing 15. A plurality of insertion hooks 97 are formed of the blank 91 such that the insertion hooks 97 are corresponding in location to the cavities 23 of the punching head 21. In addition, a plurality of reinforcing ribs 98, as shown in FIG. 8, are formed such that the reinforcing ribs 98 are corresponding in location to the ribbed slots 24 of the punching head 21. Moreover, an insertion flat part 99 is formed such that the insertion flat part 99 is corresponding in location to the insertion slot 35 of the urging plate 31. An unfinished cooling device 100 is thus made by the molding tool 10 of the present invention.

Figure 7:
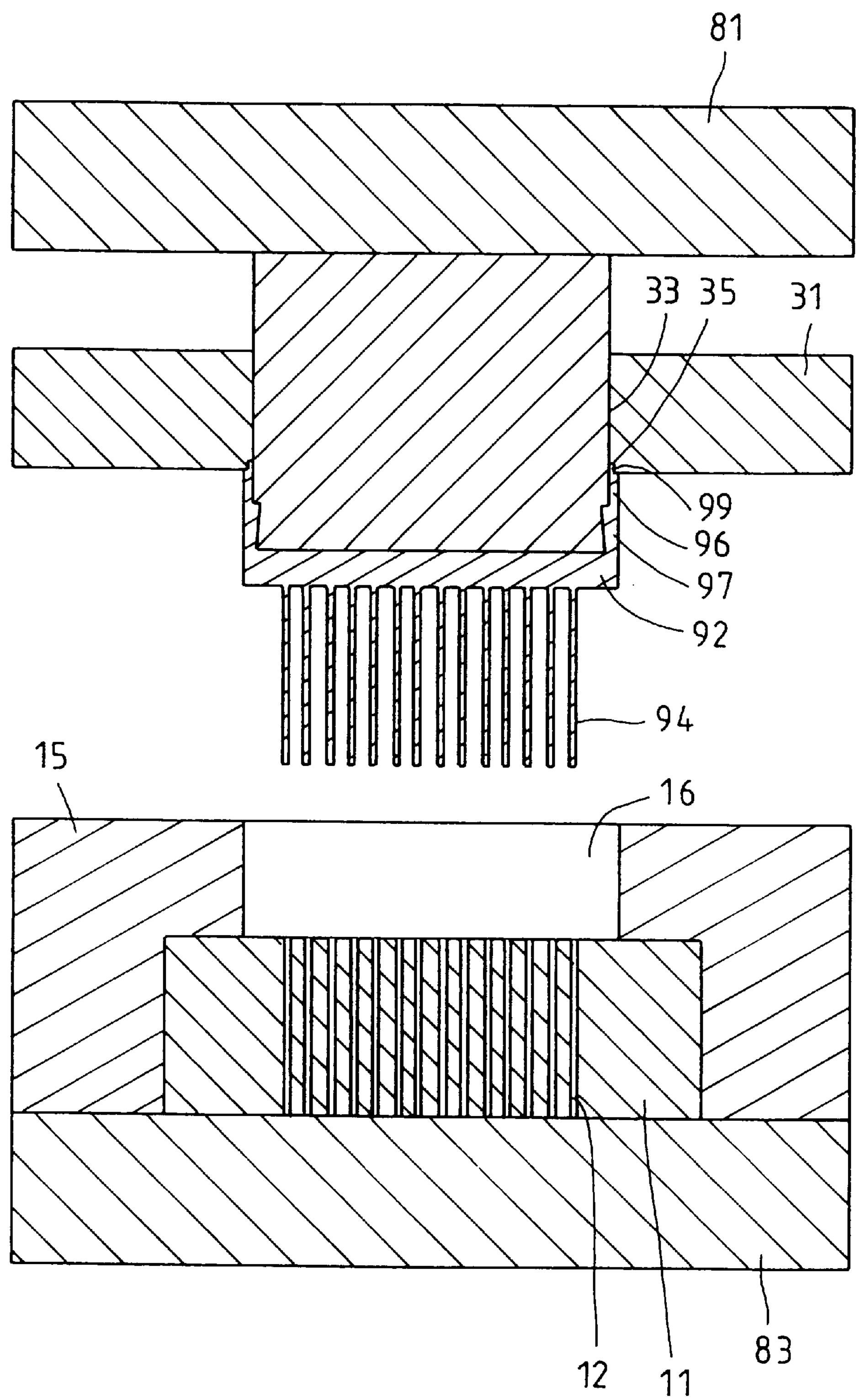
FIG. 7 shows another schematic view of the punching head of the first preferred embodiment of the present invention at work.

As shown in FIG. 7, upon completion of the production of the unfinished cooling device 100, the upper mold seat 83 of the punching machine, the punching head 21 and the urging plate 31 are displaced upward to lift the punching head 21 along with the unfinished device 100 in view of the insertion hooks 97 being engaged with the cavities 23 of the punching head 21. In light of the insertion flat part 99 being retained in the insertion slot 35 of the urging plate 31, the insertion flat part 99 is held securely to prevent the smooth ring 96 from expanding outwards at the time when the unfinished device 100 is lifted. As a result, the unfinished device 100 is held securely by the punching head 21. The reinforcing ribs 98 are intended to reinforce the structure of the smooth ring 96.

Figure 9:
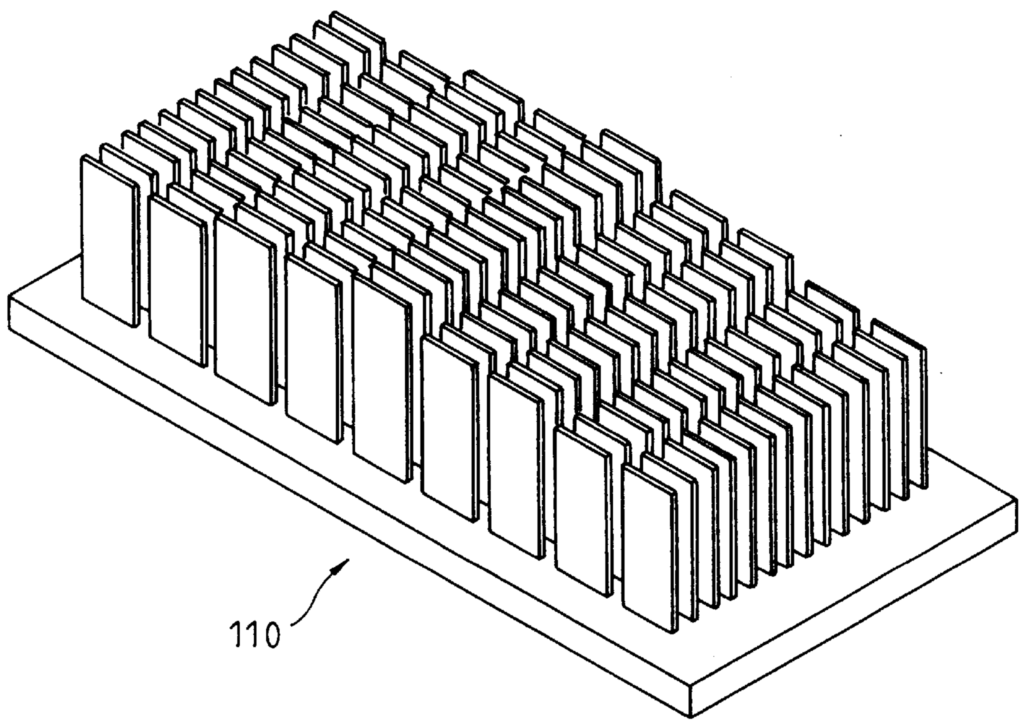
FIG. 9 shows a perspective view of a finished device of the first preferred embodiment of the present invention.

As shown in FIG. 8, the cooling fins 94 of the unfinished device 100 are so trimmed that they are flush. The smooth ring 96 is subsequently cut off. A finished device 110 is thus produced and shown in FIG. 9.

Figure 10:
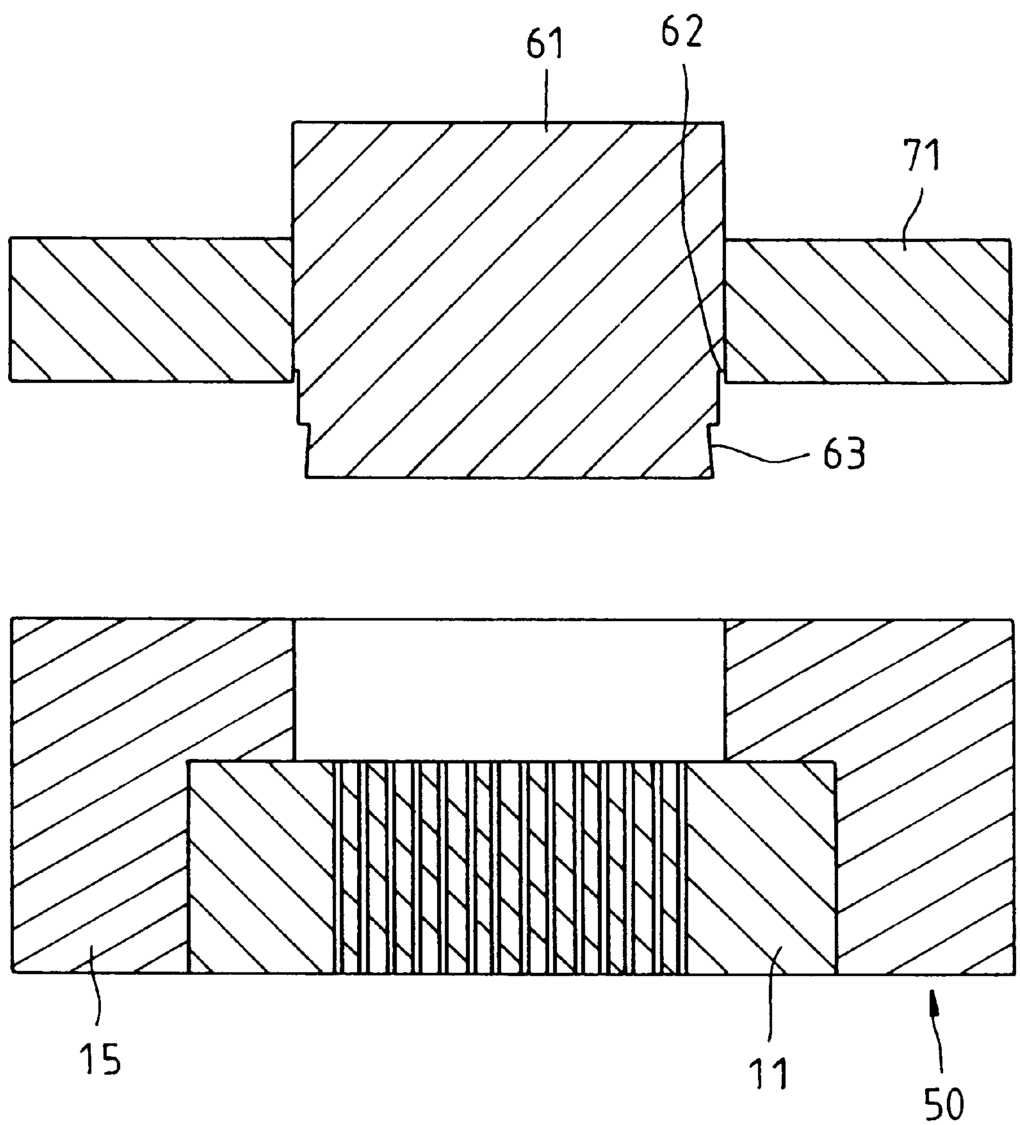
FIG. 10 shows a partial sectional view of a molding tool of a second preferred embodiment of the present invention in combination.

As shown in FIG. 10, a molding tool 50 of the second preferred embodiment of the present invention is basically similar in construction to the molding tool 10 of the first preferred embodiment of the present invention, with the difference being that the former comprises a punching head 61 which is provided in the periphery thereof with a stepped portion 62 and is further provided in the bottom edge of the periphery thereof with a plurality of cavities 63 and ribbed slots (not shown in the drawing), and further that the former comprises an urging plate 71 which is devoid of the insertion slot.

Figure 11:
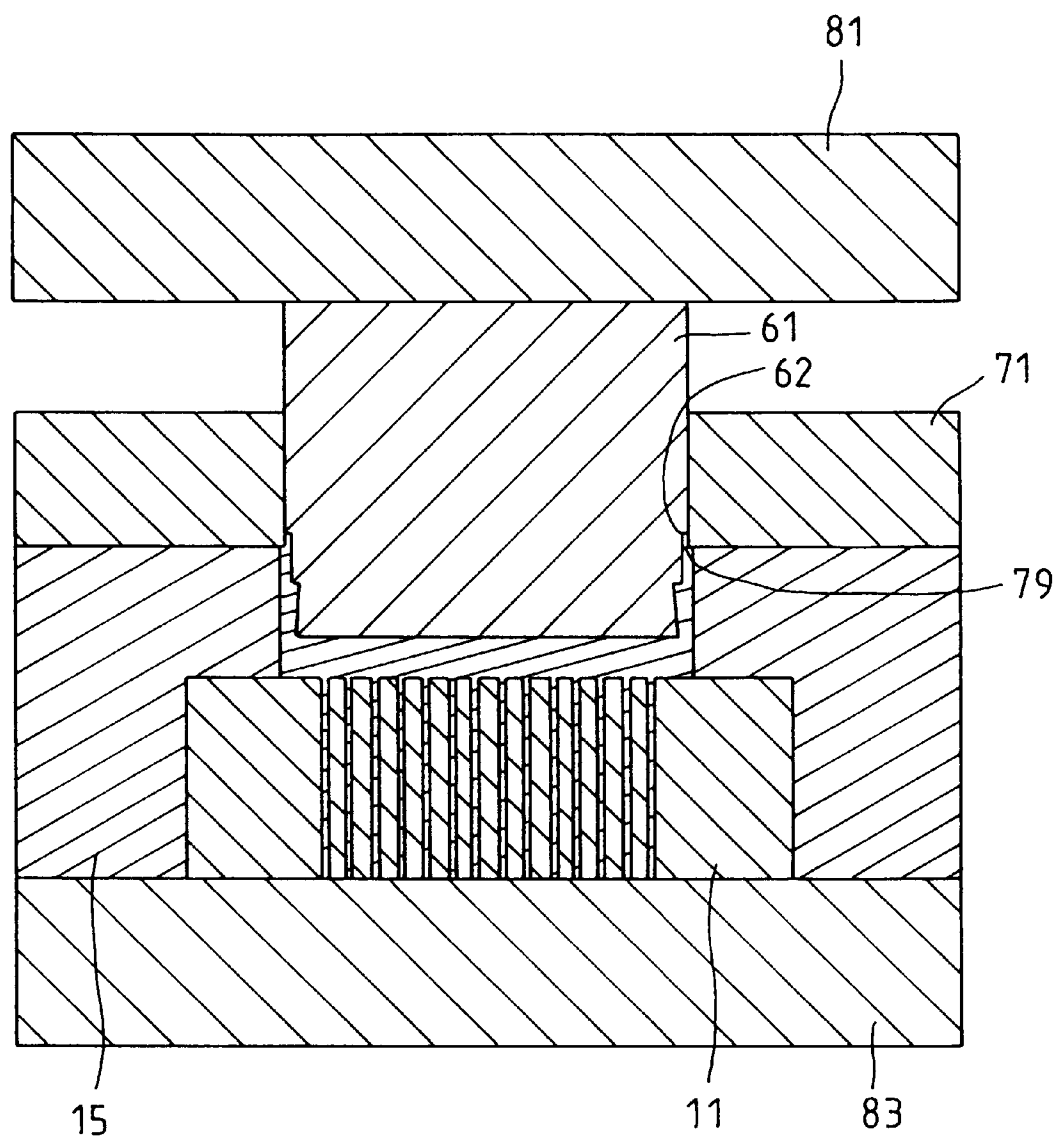
FIG. 11 shows a schematic view of the second preferred embodiment of the present invention at work.
Figure 12:
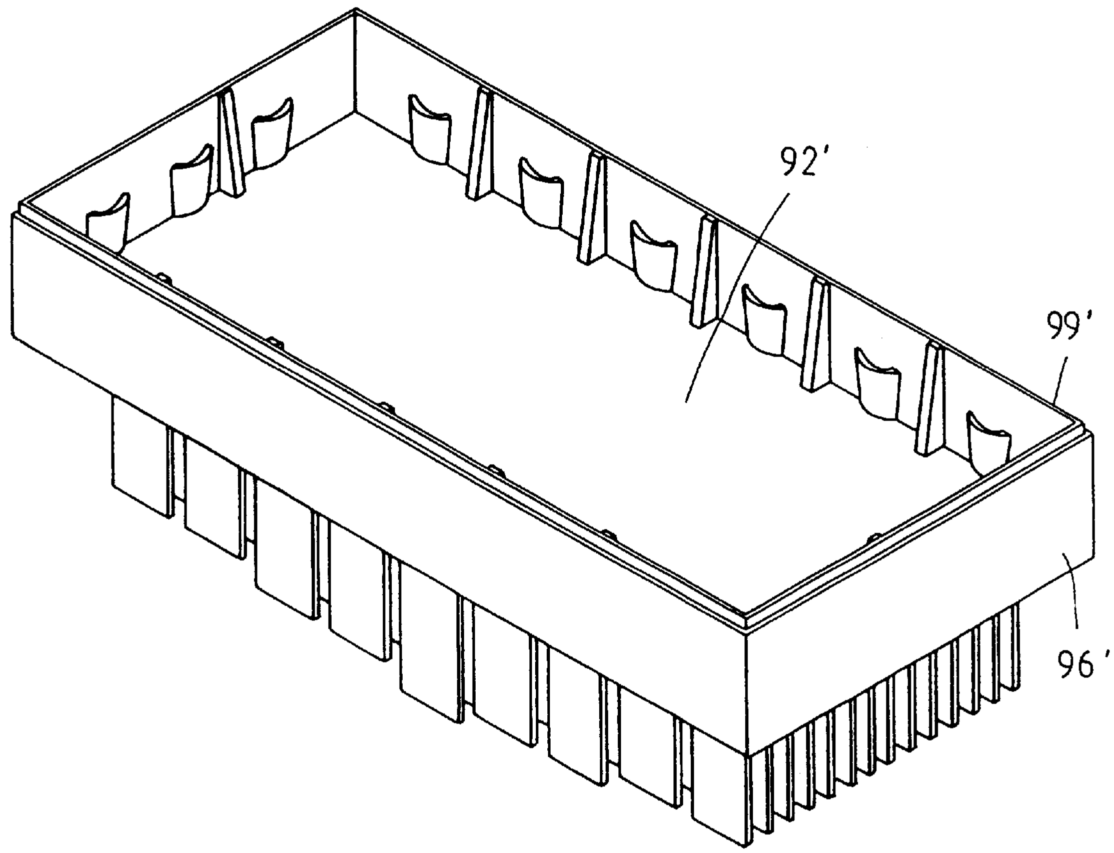
FIG. 12 shows a perspective view of a freshly-made cooling device of the second preferred embodiment of the present invention.

As shown in FIGS. 11 and 12, in the extrusion process of making a cooling device by the molding tool 50 of the second preferred embodiment of the present invention, a receiving space 79 is formed by the stepped portion 62 between the punching head 61 and the urging plate 71 and is used to form an insertion flat part 99' at the top of the smooth ring 96' of the periphery of the base plate 92'. The insertion flat part 99' is similar in function to the insertion flat part 99 as described above.

The embodiments of the present invention described above are to be regarded in all respects as being merely illustrative and not restrictive. Accordingly, the present invention may be embodied in other specific forms without deviating from the spirit thereof. For example, the urging plate 31 of the molding tool of the present invention may be provided with one insertion slot 35 extending along the edge of the opening 33, two insertion slots 35 which are located in two opposite sides of the opening 30, or four insertion slots 35 which are located in four sides of the opening 33. The present invention is therefore to be limited only by the scopes of the following appended claims.

What is claimed is:

1. A molding tool for making a cooling device, said molding tool comprising:

a lower mold provided with a plurality of through holes;

a lower mold housing provided with a molding hole and disposed on said lower mold such that said molding hole is corresponding in location to said through hole;

a punching head fastened with the upper mold seat of a punching machine such that said punching head is corresponding in location to said molding hole of said lower mold housing whereby said punching head is provided in a bottom edge of a periphery thereof with a plurality of cavities and ribbed slots; and an urging plate provided with an opening with a shape corresponding to a cross-sectional shape of said punching head, said urging plate being disposed under the upper mold seat of the punching machine such that said opening is corresponding in location to said punching head so as to enable said punching head to move through said opening, said urging plate being further provided with at least two insertion slots located in two opposite sides of said opening;

said molding hole of said lower mold housing being intended to hold therein a blank for forming the cooling device by extrusion molding by said punching head which is driven into said molding hole to extrude the blank such that a plurality of cooling fins are formed in said through holes of said lower mold, and that said cavities, said ribbed slots, and said insertion slots are filled with the blank to facilitate the releasing of the cooling fins from said molding tool.

2. The molding tool as defined in claim 1, wherein said urging plate is provided at a bottom thereof with an insertion slot extending along the edge of said opening.

3. The molding tool as defined in claim 1, wherein said urging plate is provided at a bottom thereof with a plurality of insertion slots arranged along the edge of said opening.

4. The molding tool as defined in claim 1, wherein said molding hole of said lower mold housing has a rectangular cross section; wherein said punching head has a rectangular cross section; wherein said opening of said urging plate has a rectangular cross section; and wherein said urging plate is provided in each of four sides of said opening with an insertion slot.

5. The molding tool as defined in claim 1, wherein said cavities of said punching head are biased and arcuate in cross section thereof; and wherein said ribbed slots are biased.

6. A molding tool for making a cooling device, said molding tool comprising:

a lower mold provided with a plurality of through holes;

a lower mold housing provided with a molding hole and disposed on said lower mold such that said molding hole is corresponding in location to said through holes;

a punching head fastened with the upper mold seat of a punching machine such that said punching head is corresponding in location to said molding holes of said lower mold housing whereby said punching head is provided in a periphery thereof with a stepped portion, and in a bottom edge of the periphery thereof with a plurality of cavities and ribbed slots; and an urging plate provided with an opening with a shape corresponding to a cross-sectional shape of said punching head, said urging plate being disposed under the upper mold seat of the punching machine such that said opening is corresponding in location to said punching head so as to enable said punching head to move through said opening;

said molding hole of said lower mold housing being intended to hold therein a blank for forming the cooling device by extrusion molding by said punching head which is forced into said molding hole to extrude the blank such that a plurality of cooling fins are formed in said through holes of said lower mold, and that said cavities, said ribbed slots, and a receiving space formed by said stepped portion of said punching head between said punching head and said urging plate are filled with the blank to facilitate the releasing of the cooling fins from said molding tool.

* * * * *